United States Patent [19]

Fathi

[11] Patent Number: 4,609,914
[45] Date of Patent: Sep. 2, 1986

[54] VOLTAGE MONITOR AND ALARM FOR POWER LINE

[75] Inventor: Saul S. Fathi, Huntington, N.Y.

[73] Assignee: Ultima Electronics, Ltd., Farmingdale, N.Y.

[21] Appl. No.: 602,015

[22] Filed: Apr. 19, 1984

[51] Int. Cl.[4] .................. G08B 21/00; G01R 1/02
[52] U.S. Cl. .................................... 340/660; 324/96; 324/131; 324/435
[58] Field of Search ........... 340/660, 661, 662, 663, 340/511, 384 E, 753; 324/131, 96, 122, 133, 115, 433, 434, 435, 436, 158 P, 72.5

[56] References Cited

U.S. PATENT DOCUMENTS

| | | | |
|---|---|---|---|
| 3,693,110 | 9/1972 | Briggs, Jr. et al. | 340/384 E X |
| 4,075,624 | 2/1978 | Sheff | 340/384 E |
| 4,096,473 | 6/1978 | Sweany et al. | 340/511 |
| 4,122,437 | 10/1978 | Petersen | 340/384 E X |
| 4,251,769 | 2/1981 | Ewert et al. | 324/96 |

OTHER PUBLICATIONS

"Dot/Bar-Graph Display Drivers" by M. X. Maida; Radio-Electronics, vol. 51, No. 10, Oct. 1980, pp. 96-97.

Primary Examiner—James L. Rowland
Assistant Examiner—Daniel Myer
Attorney, Agent, or Firm—Edward H. Loveman

[57] ABSTRACT

A small self-contained voltage monitoring device, which can be connected to a power line, has a display driver in circuit with a plurality of lamps to light one lamp at a time, depending on the power line voltage. A first oscillator in circuit with the display driver is actuated to operate a sound generator and alarm if the power line voltage falls outside a preset range. A second oscillator is in circuit with the first oscillator if the power line voltage is interrupted even momentarily, both oscillators are actuated by an auxiliary power source to generate a different sounding alarm. The alarm will continue to sound even if the power line voltage is restored until the auxiliary power source is manually deactivated.

13 Claims, 2 Drawing Figures

VOLTAGE MONITOR AND ALARM FOR POWER LINE

This invention relates to the art of electronic instrumentation, and more particularly concerns a device for continuously monitoring and visually indicating the voltage amplitude of an alternating current power line and for continuously generating a first audio alarm signal if the voltage of the power line drops below or rises above preset magnitudes, and for continuously generating a second audio alarm signal if the power supply voltage is interrupted, even momentarily.

It is extremely important that the voltage magnitude of an alternating power line for some computers and other equipment be maintained within a predetermined narrow range. If the voltage rises above a preset maximum, or falls below a preset minimum or if the power line is interrupted momentarily or for a long period, errors may be introduced in the computer program or equipment operation. Heretofore no satisfactory simple means for monitoring the power line at a computer installation has been available. Positive continuous indications of the magnitude of the existing power line voltage were not provided. There was no way of indicating that the power line may have been interrupted even momentarily over a long working period. There was also no way of indicating that the power line voltage had fallen below or risen above a predetermined voltage range.

The present invention is directed at providing in a small package a monitoring device, which may be plugged into a power line for a computer or other equipment for which it is necessary that the amplitude of the power line voltage be monitored continuously within a predetermined narrow range.

According to the invention, there is provided a device for monitoring the voltage of an alternating power line by illuminating one of a plurality of lamps, depending on the magnitude of the voltage of the power line. The device is provided with control means for setting the range of voltage to be monitored as well as the increments between lamps. If the power line voltage rises above or falls below the preset voltage range, an associated alarm circuit operates an audio alarm to generate a continuous audible signal. If the power line is interrupted even momentarily, a second modulated audible alarm is generated continuously, even though the voltage has been later restored. Once either alarm is generated, it continues until it is manually switched off by an attendant or service personnel. The device is wholly contained in a small package which may be located, for example, at a conventional AC outlet. It need not be located at or in the vicinity of the computer or other appliance or equipment whose power line is being monitored, but merely connected to the same power source.

These and other objects and many of the attendant advantages of this invention will be readily appreciated as the same becomes better understood by reference to the following detailed description when considered in connection with the accompanying drawings in which.

Figure 1:
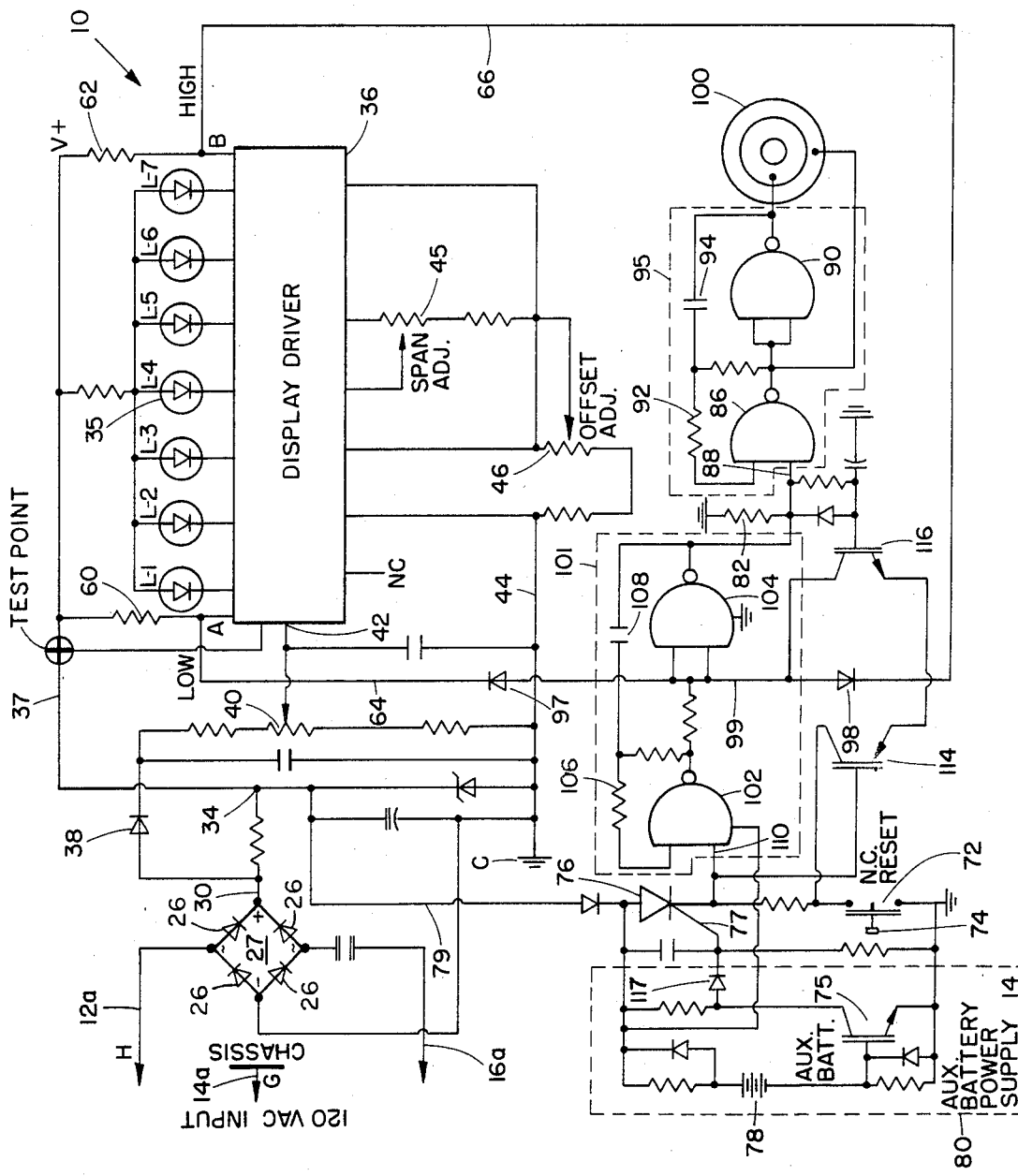
FIG. 1 is a circuit diagram of a device embodying the invention.

Referring now to the drawings, wherein like reference characters designate like or corresponding parts throughout, there is illustrated in FIG. 1 a diagram of an electronic circuit generally designated as reference numeral 10 of a device embodying the invention. The circuit 10 has input power lines 12a, 14a, and 16a which terminate in a plug having respective prongs 12, 14, and 16, (see FIG. 2) which may be inserted into a 3-terminal wall socket of an AC power line whose voltage is to be monitored by the device.

Input power lines 12 and 16 are connected to four rectifiers 26 of a full wave rectifier bridge 27. The rectifiers are connected via wire 30 to point 34 where a DC voltage of low magnitude appears for energizing seven lamps 35 associated with a display driver 36, via a wire 37. The wire 30 is also connected via a rectifier 38 to a voltage dropping variable resistor 40 which applies a DC signal voltage to the display driver 36. The display driver 36 may be one of a conventional type such as Display Driven LM3914 manufactured by National Semiconductor Corporation. This display driver is a monolithic integrated circuit that senses analog voltage levels and drives LEDs or incandescent lamps 35 selectively. Only one of the lamps or LEDS 35 is illuminated at a time depending on the amplitude of the DC voltage applied at an input 42 of the display driver 36. A return line 44 is a common or ground line isolated from a chassis 25 (see FIG. 2) and is connected between the rectifier bridge 27 and a ground C.

Variable resistors 45 and 46 are connected to the display driver 36 to adjust the range of voltage to which the lamps 35 will respond. The resistor 45 adjusts the span or overall voltage monitoring range and the resistor 46 effects adjustment or offset from the desired monitoring range. The lamps 35 (L1-L7) are disposed or arrayed in a line at the control panel 49, and may have an adjacent indexed or calibrated scale 50. The scale 50, adjacent a lighted lamp, indicates the magnitude of the power line voltage being applied to the circuit 10. The panel 49 is mounted at the front of the chassis 25 which contains the circuit 10.

SETTING THE VOLTAGE RANGE

Figure 2:
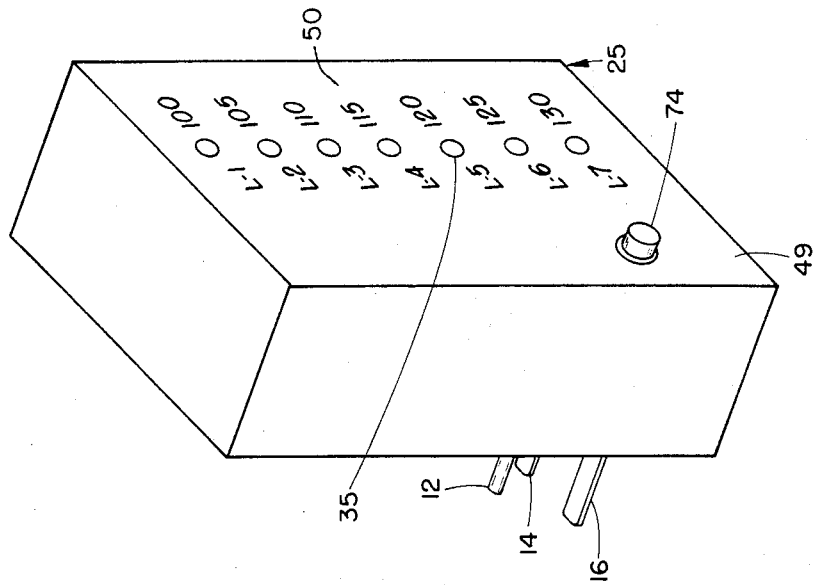
FIG. 2 is an isometric view of the front control panel of the device of FIG. 1.

Assuming there are seven lamps (L1-L7) displayed by the device as indicated in FIGS. 1 and 2, the range may be set by adjusting the resistor 45. As an example, the range can be set at 20 volts with 115 volts at the center of the range. This is shown on the scale 50 at the panel 49. Lamp L1 will light if the input voltage drops to an input of 100 volts; lamp L2 lights at 105 volts; lamp L3 lights at 110 volts; center lamp L4 lights at 115 volts; lamp L5 lights at 120 volts; lamp L6 lights at 125 volts; and Lamp L7 lights at 130 volts. In this range setting of 30 volts, there is a 5 volts increment or spacing between lamp lighting voltages which has been set by adjusting variable resistor 46. By adjustment of the resistors 45 and 46 the respective range and increment may be increased or decreased. As a further example, if the desired voltage monitoring range is 18 volts, and 115 volts is again the center of the range, lamp L1 will light at 106 volts; lamp L2 lights at 109 volts; lamp L3 lights at 112 volts; lamp L4 lights at 115 volts; lamp L5 lights at 118 volts; lamp L6 lights at 121 volts; and lamp L7 lights at 124 volts. In the first example, the voltage range was 30 volts and the voltage increment or spacing was set for 5 volts, while in the second example where the range was changed to 18 volts, the voltage increment was changed to 3 volts. The display driver 36 can be set for and desired voltage monitoring range depending on the display driver specifications. If desired, more or less than seven indicating lamps 35 may also be provided.

Adjacent to the lamps L1 and L7 are a pair of resistors 60, 62 connected to the wire 37. When a power line input voltage lower than that required to light the Lamp L1 appears at the input lines 12, 14, 16, L1 is illuminated and a voltage A appears on a wire 64 connected to the resistor 60. When a power line input voltage higher than that required to light the lamp L7 appears at input lines 12, 14, 16, L7 is illuminated and because the monitoring range has been exceeded, a voltage B appears on a wire 66 connected to the resistor 62.

ALARM SYSTEM FOR UNDERVOLTAGE, OVERVOLTAGE, AND INTERRUPTED VOLTAGE

An audible steady alarm is provided to inform an operator whether an undervoltage or overvoltage in the power line has occurred. In addition, a different sounding modulated audible alarm has been provided to inform the operator if an interruption of the power line has occurred. When the power failure alarm is triggered, an auxiliary battery circuit 80 is utilized to power the alarm circuit so that even if the power supply is restored after the alarm has been actuated, the triggered alarm will continue to sound until manually deactivated as will hereinafter be more fully explained. If the voltage in the power line exceeds the range (lower or higher) the alarm will sound and continue until manually deactivated. The battery circuit 80 includes a conventional 9 volt battery 78 which receives a trickle charge from the power line lead 79. A normally closed switch 72 is connected across the terminals of the battery 78 via an SCR (Silicon Controlled Rectifier) 76 and a normally conducting transistor 75. The switch 72 is manually operable by means of a push button 74 located at the control panel 49 (FIG. 2). A grounded resistor 82 is connected between the output of a NAND gate 104 and an input 88 of a NAND gate 86. The input 88 to the NAND gate 86 is also coupled to the base of a transistor 116 whose collector is connected to the wire 66 via a diode 98 and connected to the wire 64 via a wire 99 and a diode 97. The NAND gate 86 is connected in circuit with a NAND gate 90, a resistor 92 and a capacitor 94 to constitute a tuned oscillator circuit 95 of a predetermined frequency whose output is applied to terminals of a bell or buzzer of an audible alarm 100.

Another oscillator circuit 101 is constituted by a pair of interconnected NAND gates 102, 104 a resistor 106 and a capacitor 108. The oscillator circuit 101 produces an output frequency which is imposed upon the oscillator 95 thereby modulating the frequency oscillator 95 and producing a fluctuating or warbling sound. The output from the SCR 76 is connected to an input 110 of the NAND gate 102. A transistor 114 has its base connected to the input 110 of the NAND gate 102. The transistor 116 is connected to the transistor 114 in a typical emitter follower configuration.

In operation of the circuit suppose the voltage at input lines 12, 14, 16 falls below the lowest voltages of the range of the display driver 36, the lamp L1 will light, and the display driver 36 will produce a voltage A in the wire 64. This voltage will be applied via the diode 97, and the wire 99, to the collector of the transistor 116, causing the transistor 116 to conduct and produce a pulse at the input 88 of the NAND gate 86 and in turn cause the oscillator 95 to actuate and trigger the alarm 100 with a particular frequency. When the transistor 114 conducts and the transistor 116 conducts they act as a latch. Thus, even if the voltage at the input lines 12, 14, 16 changes to fall within the preset range, the alarm 100 will sound. The alarm will continue to sound until the push button 74 is pushed manually to turn off the transistor 114, which turns off the transistor 116 and in turn, turns off the oscillator 95 to silence the alarm 100.

If the power supply input rises above the preset range for lighting lamps 35 (L1–L7), the display driver 36 will generate a voltage B which will be applied to the collector of the transistor 116 via the diode 98, in much the same manner as if the voltage fell below the lowest value of the preset range, and as before, the oscillator 95 will sound the alarm 100. The alarm may be silenced by pushing the push button 74 to turn off the transistor 114 which will turn off the transistor 116 and the oscillator 95.

If the power line voltage is in the preset voltage range for lighting one of the lamps 35, but the power line is interrupted momentarily or for a longer time, the normally conducting transistor 75 will shut off, and the gate 77 of the SCR 76 will be positive to turn on the SCR 76 which will conduct and provide a pulse to the input 110 of the NAND gate 102, thereby turning on the oscillator 101. The output from the NAND gate 104 of the oscillator 101 is applied to the input 88 of the NAND gate 86 of oscillator 95 thereby turning on the oscillator 95. The resulting alarm will be a warbling or modulated sound since both oscillators 95 and 101 are operating. The alarm will continue to sound until the button 74 is actuated to open the switch 72 thereby turning off the SCR 76 to turn off the oscillator 101 and in turn, turn off the oscillator 95.

It will be apparent from the foregoing that a continuous audible signal of single frequency or pitch is produced when the power line input voltage rises above or falls below the range set for lighting lamps 35. Furthermore a fluctuating or warbling signal will be produced if the power line input voltage is interrupted momentarily or for a longer period. In all cases, opening normally closed switch 72 silences the alarm. The present invention thus alerts an attendant when an excessive change in voltage magnitude or interruption of power line occurs. The attendant can then check and service any apparatus, appliances, or equipment connected to the same power line, if their proper operation depends on substantially constant and uninterrupted power line.

The present monitoring device can be a very small unit located adjacent to and plugged into a wall socket of the same power line which powers computers or other appliances whose power line must be maintained constant. The device provides visual indications at all times when the power supply is within the preset voltage range. If the voltage rises or falls excessively or is cut off at any time, the alarm is sounded continuously even though proper voltage is thereafter restored. When the alarm sounds because the power line voltage is beyond the range, a visual indication displays to the operator which end of the range was exceeded. The monitoring device thus provides a safety system since no deviation of the applied power line voltage can occur even momentarily from prescribed limits without sounding the alarm, and once the alarm sounds it will be kept on and thus, cannot be ignored, and a service personnel must turn if off.

It should be understood that the foregoing relates to only a preferred embodiment of the invention which has been by way of example only and that it is intended to cover all changes and modifications of the example of the invention herein chosen for the purpose of the disclosure, which do not constitute departures from the spirit and scope of the invention.

What is claimed is:

1. A device for monitoring the voltage of an electrical power line means, comprising:
   a plurality of lamps in circuit with said power line means;
   a display driver in circuit with said lamps and said power line means and arranged to light one lamp at a time depending on the voltage of said power line means in a predetermined voltage range;
   oscillator means in circuit with said display driver for generating a fixed frequency signal when said voltage of said power line means is outside said voltage range;
   an audible sound generator in circuit with said oscillator means and driven thereby to sound an alarm when said oscillator means generates said signal;
   an auxiliary power supply connected in circuit with said oscillator means; and
   electronic latching means in circuit with said auxiliary power supply and said oscillator means and arranged to pass a driving current to said oscillator means to keep the same energized and generating said signal, so that said alarm continues to sound even though said voltage of said power line means returns to a magnitude within said predetermined voltage range.

2. A device as defined in claim 1, further comprising manual switch means in circuit with said electronic means and arranged to deenergize the same when said switch means is operated for cutting off said auxiliary power supply from said oscillator means to stop sounding said alarm.

3. A device as defined in claim 2, further comprising another oscillator means in circuit with said first named oscillator means and said power line means and arranged to generate another signal of other fixed frequency while said first named oscillator means generates said fixed frequency signal when said power line means is interrupted, even momentarily, so that said sound generator sounds said alarm different in sound from said first named alarm.

4. A device as described in claim 3, further including an electronic switch means connected in circuit with said other oscillator means and said auxiliary power supply to keep said other oscillator means and said first named oscillator means energized to generate signals to sound said alarm even though said voltage of said power line means is restored.

5. A device as defined in claim 4, wherein said manual switch means is further connected in circuit with said electronic switch means to cut off said electronic switch and thereby stop the sound of said alarm.

6. A device as defined in claim 5, wherein said first named oscillator means comprises a plurality of gates responsive to application of power to generate said signal of said fixed frequency.

7. A device as defined in claim 6, wherein said other oscillator means comprises another plurality of gates responsive to application of power from said auxiliary power source to generate said other signal.

8. A device as defined in claim 7, wherein said manual switch means is a normally closed manually operable switch, so that said latching means is deactivated to deactivate said sound generator when said switch is manually opened.

9. A device as defined in claim 8, wherein said latching means is a silicon controlled rectifier, which is arranged and triggered to conduct power from said auxiliary power source when said power line means is cut off, and which continues to conduct power even after said cut off power line means is restored.

10. A device as defined in claim 9, wherein said auxiliary power source is a battery arranged to supply power to said first named and other oscillator means independently of said power line means.

11. A device as defined in claim 10, further comprising adjustable means in circuit with said display driver for presetting said voltage range within which said lamps will selectively light.

12. A device as defined in claim 10, wherein said battery is in circuit with said power supply line to receive a trickle charge therefrom.

13. A device for monitoring the voltage of an electrical power supply, comprising:
   a housing;
   a conventional electric plug extending from said housing and adapted to be connected to said electrical power supply;
   a plurality of lamps in said housing and visible externally thereof, said lamps in circuit with said plug;
   a display driver in circuit with said lamps and said plug and arranged to light one lamp at a time depending on the voltage of said electrical power supply in a predetermined voltage range;
   oscillator means in circuit with said display driver for generating a fixed frequency signal when said voltage of said power supply is outside said voltage range;
   an audible sound generator in circuit with said oscillator means and driven thereby to sound an alarm when said oscillator means generates said signal;
   another oscillator means in circuit with said first named oscillator means and arranged to generate another signal of other fixed frequency when said first named oscillator means generates said fixed frequency signal and when said power supply is interrupted, even momentarily, and to impose said other signal on said other oscillator means, so that said sound generator sounds said alarm different in sound from said first named alarm;
   an auxiliary power source connected in circuit with said other oscillator means;
   electronic switch means in circuit with said auxiliary power source and said other oscillator means and arranged to pass a driving current to said other oscillator means to keep the same energized and generating said other signal when said power supply is interrupted, so that said alarm continues to sound even though said voltage of said power supply returns to a normal magnitude within said predetermined voltage range;
   a manual switch means in circuit with said electronic switch means and arranged to deenergize the same when said manual switch means is operated for cutting off said power source from said other oscillator means to stop the sound of said alarm;
   an electronic latching means connected in circuit with said other oscillator means to keep said first named oscillator means energized and generating signals so that said sound generator continues to sound said alarm even though said voltage of said power supply is restored within said predetermined range.

* * * * *